SEMICONDUCTOR PULSE SHIFTER

Filed Sept. 30, 1960

INVENTOR
Akihiko Sato
BY Roy C. Hopgood
ATTORNEY 3,175,099
Patented Mar. 23, 1965

3,175,099
SEMICONDUCTOR PULSE SHIFTER

Akihiko Sato, Tokyo, Japan, assignor to Nippon Electric Company Limited, Tokyo, Japan, a corporation of Japan Filed Sept. 30, 1960, Ser. No. 59,542
Claims priority, application Japan, Oct. 3, 1959, 34/31,445
11 Claims. (Cl. 307—88.5)

This invention relates to semiconductor devices and more particularly to such devices intended for pulse shifting.

Semiconductor pulse shifters have previously been proposed wherein an array of rectifying electrodes internally arranged in a semiconductor body are to be switched sequentially in status in response to successive pulses from an external source. Due to waste space and other inherent faults which will be pointed out subsequently in the detailed description, the previously proposed devices have been generally impractical.

The present invention has for an object the provision of a novel pulse shifter and more particularly a novel semiconductor pulse shifter which will avoid the defects of the previously proposed semiconductor pulse shifters and be capable of operating accurately and effectively to shift pulses.

A feature of the present invention resides in the utilization of an electrical field in the semiconductor body to promote and serve as a determinant of pulse shifting in a required direction along an array of rectifying electrodes within the semiconductor body.

More specifically, the invention provides a semiconductor pulse shifter characterized by a semiconductor body inherently constructed to form an electric field in the direction in which the rectifying electrodes are arrayed in the semiconductor body and which electric field will act to promote pulse shifting along the array of electrodes. According to the invention, the electric field will vary in a manner conducive to pulse shifting action in a predetermined direction from one electrode to the next in the array. The use of the electric field as a pulse shift determinant enables the invention to provide, as pulse responsive electrodes, elements of smaller size and closer together, without waste space, than possible with the previously proposed semiconductor pulse shifters.

An object of the invention is to provide a semiconductor pulse shifter formed with a semiconductor region bounding rectifying electrodes having circuit connection to external pulse supply means, the semiconductor region being formed of material varying in resistance in the direction in which the rectifying electrodes are arranged, whereby a varying electric field in said direction is inherently provided by the nature of the semiconductor region for promoting directional switching in state of the electrodes under control of the pulses from the external pulse supply means.

The invention provides a semiconductor device wherein a plurality of rectifying electrodes are separated one from another and arranged in a row within a semiconductor region bounded by substantially non-rectifying contact electrodes, and wherein an internal electric field is formed by the nature of the semiconductor itself in the direction in which the rectifying electrodes are arranged, said rectifying electrodes being separated every other one into two groups, and each of said two groups being impressed with electric voltage which is supplied by switching of external voltage sources in such a way as to make the voltage difference between each of the two groups and one of the non-rectifying electrodes always different, whereby conductive operational status can be shifted in succession in one direction between adjacent rectifying electrodes when a series of pulsive signals are given to the semiconductor device.

The above-mentioned and other features and objects of this invention and the manner of attaining them will become more apparent and the invention itself will be best understood by reference to the following description of an embodiment of the invention taken in conjunction with the accompanying drawing, wherein:

FIG. 1, part (*a*) is a construction and circuit diagram of a typical previously proposed form of semiconductor pulse shifter, and part (*b*) is an enlarged diagram of one of the electrode strips of the device in part (*a*).

Figure 5:
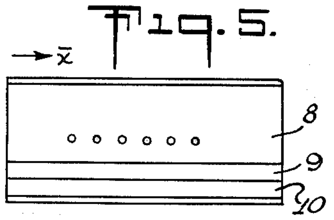
Figure 4:
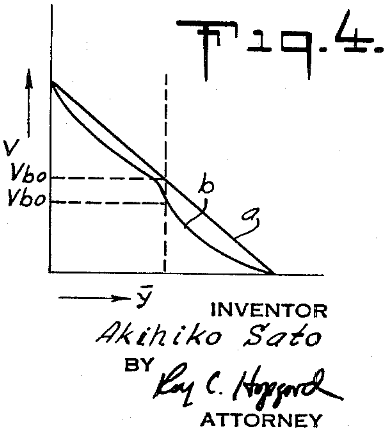

FIG. 4 indicates voltage distribution explanatory of the function of my new device; and FIG. 5 is an elementary construction diagram of another embodiment of my invention, which embodiment is a semiconductor pulse shifter utilizing the hook double base construction.

Figure 1:
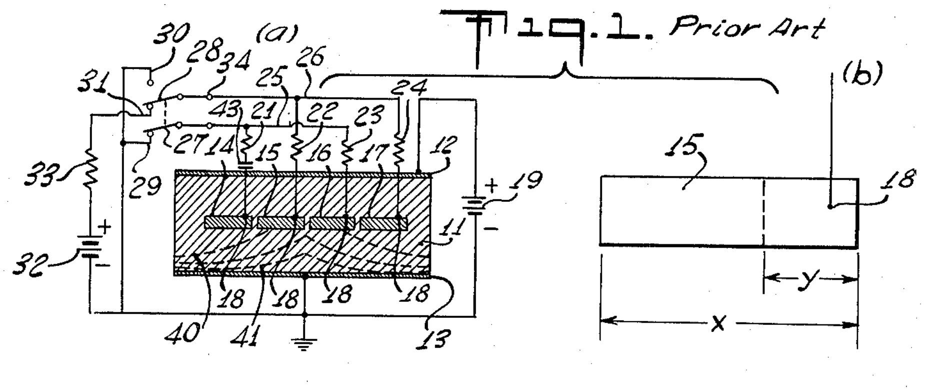
FIG. 1. Prior Art

Various devices have been proposed by the prior art in which semiconductors are intended to function as the equivalent of decatron discharge tubes or analogous devices for pulse shifting. The device shown in FIG. 1(*a*) is an example of such previously proposed semiconductor pulse shifters. The principle of this FIG. 1(*a*) device is as follows: the P type strips 14, 15, 16 and 17 have 100 ohms resistance. When the positive hole injection is performed from one of the strips, say strip 15, the injection is performed not from all over the distance $x$—see FIG. 1(*b*)—but, due to the resistance drop, only from its leading end portion $y$, with the result that the injected current and the consequent conduction in the N type semiconductor body are modulated locally. When the strip 15 becomes conductive, the conduction modulation in the semiconductor moves toward the strip 16 and far away from the strip 14, thus making the strip 16 extremely favored for pulse injection and enabling the pulse transference from the strip 15 to the strip 16. From these considerations, it now becomes clear that the smaller the ratio $y/x$, the better for accurate operation of this device. This means that the space of this device for each $x$-$y$ distance is waste space, with consequent limitation to the number of the electrode strips, the lengthening of the device because of such waste spaces, and more high frequency characteristics. These faults make the previously proposed devices, exemplified by the FIG. 1 device, impractical.

My invention provides a practical semiconductor pulse shifter which does not have the waste space, space limitations and other faults of the previously proposed devices and which allows use of many elements in the semiconductor which can be switched and transformed in state at high speed. The principle of my novel device will be explained in detail below with particular reference to the FIG. 2 embodiment of my invention.

Figure 2:
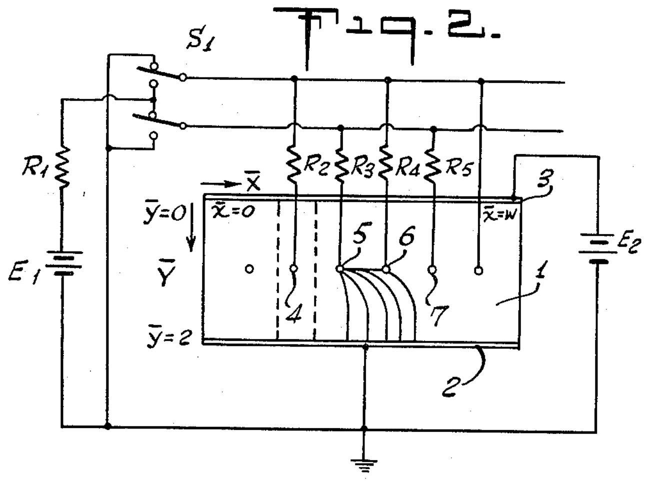
FIG. 2 is a construction and circuit diagram of one embodiment of a semiconductor pulse shifter according to my invention.

Referring to FIG. 2, it shows a device consisting of an N type semiconductor 1 provided with ohmic contact electrodes 2 and 3 and with dot regions 4, 5 and 6 of P type and of respectively small area. Each interval containing a P type dot, such as the interval shown by the dashed lines at oposite sides of the dot 4, acts as if it were a double base diode.

According to my invention, a special feature of this device is that the semiconductor body 1 is a material whose specific resistance is not uniform but decreases in the direction of $\overline{x}$. This produces a potential difference in the direction of $\bar{x}$ represented by the following equation and forming an electric field E in the direction of $\bar{x}$:

$$\Delta V = \frac{kT}{e} \log \frac{Pw}{Po}$$

where:

$\Delta V$ is the potential difference between $\bar{x}=0$ and $\bar{x}=w$,
$Po$, the specific resistance at $\bar{x}=0$
$Pw$, the specific resistance at $\bar{x}=w$
$k$, the Boltzman's constant
T, absolute temperature, and
$e$, electron charge.

Figure 3:
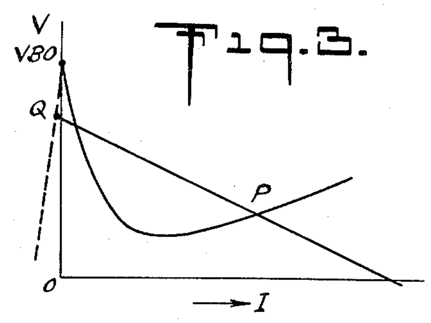
FIG. 3 represents voltage-current characteristics of a negative resistance unit internal of my new device shown in FIG. 2.

Assume that the switch $S_1$ is connected upward and that the dot 5 is conductive. The interval containing a dot exhibits the negative resistance characteristics of an ordinary double base diode, as indicated in FIG. 3, and since the interval has two states, "on" and "off," represented by P and Q (FIG. 3), the operating point of the interval containing the dot 5, which was assumed to be conductive, now is at the point P. The positive hole injected from the dot 5 always flows rightwards (as viewed in FIG. 2) due to the internal electric field in the semiconductor in the direction of $\bar{x}$. From the positive hole flow lines shown by the full lines, the portion directly below the dot 6 is conductance-modulated and the potential of this portion falls. Since there is now no positive hole current flow directly below the dot 4, potential does not drop thereat. Consequently, the brake voltage $Vbo'$ of the interval containing the dot 6 falls effectively with respect to the brake voltage $Vbo$ of the characteristic (FIG. 3) of the interval containing the dot 4. This relation is shown in FIG. 4 wherein the potential distributions of intervals containing the dots 4 and 6 in the direction of $\bar{y}$, are shown by the lines $a$ and $b$, respectively, and the breakdown voltage $Vbo'$ at the dot 6 is shown below $Vbo$.

Connect the switch $S_1$ downward under this condition. If the impressed voltage $E_1$ holds the relation $Vbo>E_1>Vbo'$, the dot 6, whose voltage exceeds the break voltage, triggers to "on" state, while the dot 4, whose voltage is below the breakdown voltage, stays in "off" state. In other words, the pulse will move from the dot 5 circuit to the dot 6 in one direction, $\bar{x}$, the direction of decreasing specific resistance of the semiconductor 1.

This pulse transfer operation corresponds to pulse transfer in a decatron, making it possible to apply my device in various circuits for exactly the same purposes as the decatron or analogous device.

As obvious from the explanation of my semiconductor device, the transformation speed of the pulse from eleelement to element, as from the dot 5 to the dot 6, is improved because (1) the spacing between the elements, as between dots 5 and 6, can be shortened and because (2), due to the movement of the positive hole caused by the electric field, the conduction modulation is performed more rapidly than that caused by pure diffusion current. Furthermore, this device is extremely easy to manufacture, because neither the construction problem nor the dot spacing precision need be extremely critical.

The number of elements that can be arranged in this device can be calculated as follows: since the minimum required voltage to cause the motion in the direction of $\bar{y}$ must be equivalent to the thermal kinetic energy voltage $kT/e$, it is 26 mv. at an ordinary temperature. Since the maximum value of the voltage difference obtainable in a germanium semiconductor is about one-half of the energy gap or approximately 0.4 v., the maximum number of the elements is in the order of 0.4/0.026=15. If silicon is used, it will be in the order of 23.

The above explanation dealt with an embodiment of the invention in which the specific resistance of the semiconductor body changed in the direction of $\bar{x}$ in order to form an electric field in the semiconductor, but a semiconductor material whose energy gap is continuously changed in the direction of $\bar{x}$, also may be used as a method to form an internal electric field. For instance, the internal electric field can be formed by using a germanium-silicon alloy which is germanium at $\bar{x}=0$ and silicon at $\bar{x}=w$. Formation of an internal electric field by such means has already been proved by this inventor, in the specification of the Japanese Patent No. 242,489.

It is apparent that according to the principle of this invention, each element is not simply limited to one which shows the double base diode features, but any switch element having negative resistance may be used.

Another example of the invention is shown in FIG. 5 where each element is a double base diode having hook construction in which 8 and 10 are N type regions and 9 is a P type region.

The performance characteristics of this hook type double base diode is explained by this inventor in the Journal of the Institute of Electrical Communication Engineers of Japan, vol. 41, No. 11. To manufacture this semiconductor device, first, as a region 8, take an N type semiconductor whose resistance varies continuously, then, by the double diffusion method, form the P type region 9 and the N type region 10 thereto. It is not necessary that the region 9 and the region 10 themselves have resistance changes in the direction of $\bar{x}$.

While the foregoing description sets forth the principles of the invention in connection with specific apparatus, it is to be understood that this description is made only by way of example and not as a limitation of the scope of the invention as set forth in the objects thereof and in the accompanying claims.

What I claim is:

1. A semiconductor pulse shifter comprising a semiconductor region, means within said semiconductor region for generating an internal electric field in a given direction, a plurality of spaced rectifying electrodes arrayed internally in the semiconductor region and arrayed along said given direction, and means for applying externally originated pulsive signals to said electrodes to effect switching of the electrodes sequentially under the directive influence of said internal electric field.

2. The invention according to claim 1, said generating means comprising semiconductive material of varying specific resistance, decreasing from interval to interval of the semiconductor region in said given direction, the varying specific resistance of the material determining said internal electric field.

3. A semiconductor pulse shifter comprising a semiconductor region, substantially non-rectifying electrodes bounding said region and having connections to a voltage source for applying voltage therefrom across the semiconductor region in one direction, means for generating an electric field internally within the semiconductor region by the nature of the semiconductor material in a direction angular to the previously mentioned direction, and a plurality of spaced rectifying electrodes arrayed in said region in the direction of said electric field.

4. A semiconductor pulse shifter formed with a semiconductor region bounding rectifying electrodes having circuit connection to external pulse supply means, said rectifying electrodes being arrayed in line along said semiconductor region,
   the semiconductor region being formed of material having a varying specific resistance which decreases in the direction in which rectifying electrodes are arranged, whereby an electric field in said direction is inherently provided by the nature of the semiconductor region for promoting directional switching in state of the electrodes.

5. A semiconductor pulse shifter comprising semiconductive bulk material,
   a plurality of spaced semiconductive elements integrally formed within said bulk material and arrayed in line along said bulk material, said elements in their environment exhibiting negative resistance characteristics thereby being adapted to operate as a switch, said bulk material having a varying specific resistance which decreases in a direction substantially along the direction of said elements, and menas for applying a potential gradient across said bulk material transverse to said line of semiconductive elements.

6. A semiconductor pulse shifter comprising semiconductive bulk material, a plurality of spaced semiconductive elements integrally formed within said bulk material and arranged in line along said bulk material, said elements in their environment exhibiting negative resistance characteristics thereby being adapted to operate as a switch, said bulk material having an energy gap which continuously decreases in a direction substantially along the direction of said elements, and means for applying a potential gradient across said bulk material transverse to said line of semiconductive elements.

7. The semiconductor pulse shifter of claim 6 in which the variation of said energy gap is formed by a semiconductive material comprising a germanium-silicon alloy, the relative proportion of which decreases in a direction substantially along the direction of said elements.

8. The semiconductor pulse shifter of claim 5 in which the semiconductive material is of one conductivity type and in which the switching element is formed of the other conductivity type material.

9. A semiconductor pulse shifter comprising a semiconductor region, substantially non-rectifying electrodes bounding said region and having connections to a voltage source for applying voltage therefrom across the semiconductor region in one direction, semiconductive material means within said semiconductor region for generating an internal electric field therewithin by the nature of the semiconductor material in a direction angular to the previously mentioned direction, and a plurality of spaced rectifying electrodes arrayed in line in said region in the direction of said electric field.

10. The semiconductor pulse shifter of claim 9 in which the specific resistance of said semiconductive material decreases in a direction substantially along the direction of said elements.

11. The semiconductor pulse shifter of claim 3 in which additional layers of semiconductive material are junctioned below said semiconductive material, said layers having alternate P and N characteristics.

References Cited by the Examiner

UNITED STATES PATENTS

| | | | |
|---|---|---|---|
| 2,877,358 | 3/59 | Ross | 307—88.5 |
| 3,038,085 | 6/62 | Wallmark et al. | 307—88.5 |
| 3,070,711 | 12/62 | Marcus et al. | 307—88.5 |

OTHER REFERENCES

"Double Negative Resistance Device," R. F. Rutz, IBM Technical Disclosure Bulletin, vol. 2, No. 1, June 1959, page 22.

JOHN W. HUCKERT, *Primary Examiner.*

HERMAN KARL SAALBACH, ARTHUR GAUSS, *Examiners.*